(12) United States Patent
Hoogerdijk

(10) Patent No.: US 7,136,288 B2
(45) Date of Patent: Nov. 14, 2006

(54) MEMORY DEVICE

(75) Inventor: Dirk Cornelis Hoogerdijk, Schilde (BE)

(73) Assignee: Freecom Technologies B.V., Delft (NL)

( * ) Notice: Subject to any disclaimer, the term of this patent is extended or adjusted under 35 U.S.C. 154(b) by 76 days.

(21) Appl. No.: 10/745,167

(22) Filed: Dec. 23, 2003

(65) Prior Publication Data

US 2004/0139279 A1 Jul. 15, 2004

Related U.S. Application Data

(63) Continuation of application No. PCT/NL03/00104, filed on Feb. 13, 2003.

(30) Foreign Application Priority Data

Dec. 30, 2002 (NL) .................................. 1022277

(51) Int. Cl.
*H05K 1/14* (2006.01)

(52) U.S. Cl. ............... 361/737; 361/797; 361/769; 361/684; 439/638; 710/74

(58) Field of Classification Search ............... 361/737, 361/797, 686, 769–684; 439/638, 131; 711/115; 710/74, 301
See application file for complete search history.

(56) References Cited

U.S. PATENT DOCUMENTS 5,655,143 A * 8/1997 Alpert et al. ............... 361/600
5,691,882 A * 11/1997 Ma ............................ 361/684
6,058,089 A * 5/2000 Youens et al. .............. 720/652
6,334,788 B1 * 1/2002 Sakaguchi et al. .......... 439/528
6,359,764 B1 * 3/2002 Chou ......................... 361/93.1
6,567,273 B1 5/2003 Liu et al. .................... 361/737
6,705,891 B1 * 3/2004 Lin ............................ 439/528
6,792,487 B1 * 9/2004 Kao ............................ 710/74
6,859,361 B1 * 2/2005 Mambakkam et al. ...... 361/684
6,926,554 B1 * 8/2005 Liow et al. ................. 439/528
2003/0148656 A1 * 8/2003 Huang ........................ 439/501
2004/0208035 A1 * 10/2004 Solomon et al. ............ 365/51

FOREIGN PATENT DOCUMENTS

| DE | 202 07 720 U1 | 8/2002 |
| DE | 202 11 121 U1 | 10/2002 |
| EP | 1 146 428 A1 | 10/2001 |

* cited by examiner

*Primary Examiner*—K. Cuneo
*Assistant Examiner*—Hung S. Bui
(74) *Attorney, Agent, or Firm*—Steven M. Koehler; Westman, Champlin & Kelly, P.A.

(57) ABSTRACT

A memory device is provided with a memory chip and a controller, which can be connected to a computer via a USB connector. The memory device is implemented in the form of a flat memory card, wherein the USB connector is movable between a position of rest, in which the connector is accommodated in an opening of the memory card, and an operative position, in which the connector projects beyond the perimeter of the memory card. The opening is a rectangular opening lying entirely within the perimeter of the memory card, wherein in the position of rest the USB connector is positioned entirely within the confines of the memory card.

12 Claims, 2 Drawing Sheets

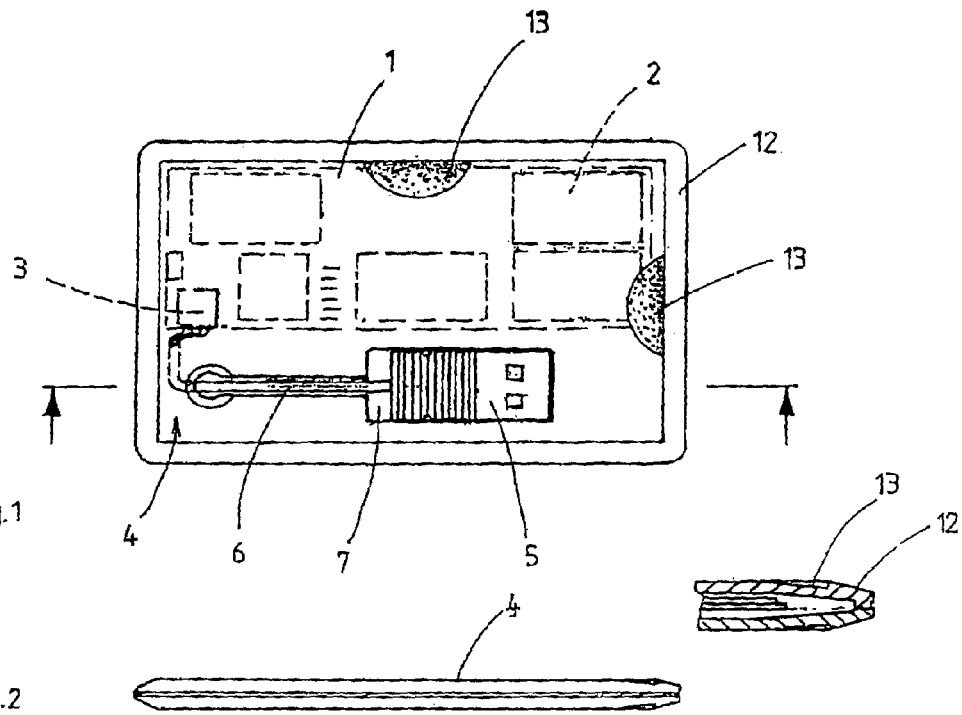
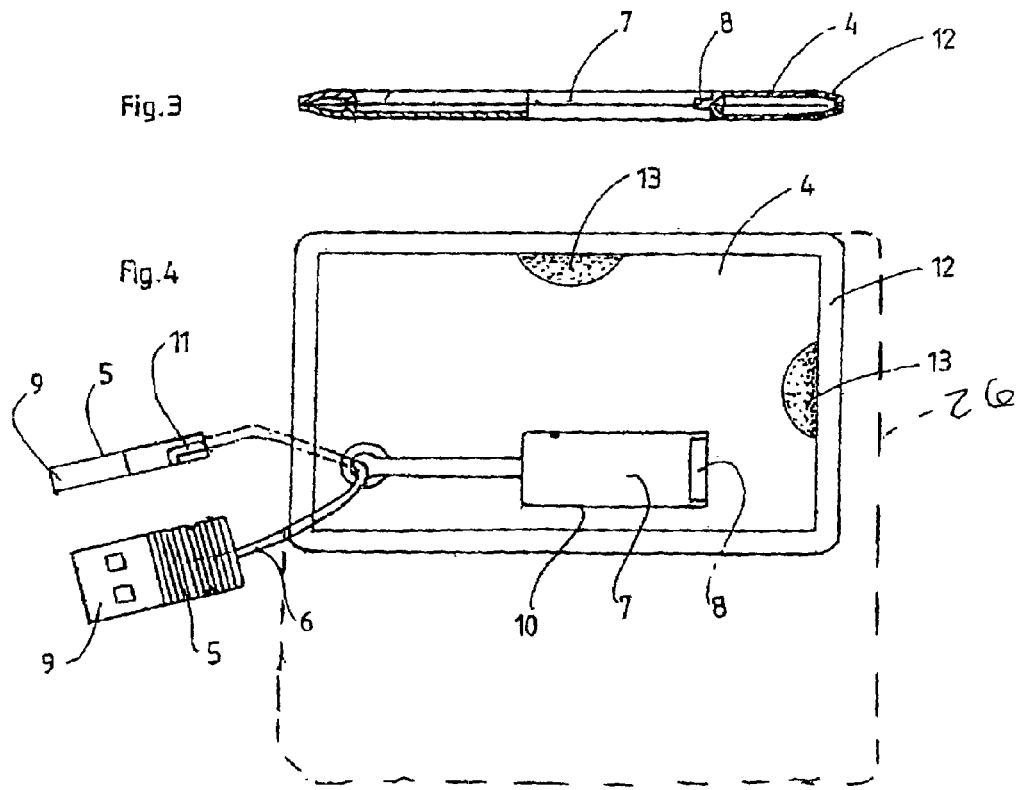

MEMORY DEVICE

CROSS-REFERENCE TO RELATED APPLICATION

This Application claims priority and is a continuation application of International Application No. PCT/NL03/00104, filed Feb. 13, 2003, published in English.

BACKGROUND OF THE INVENTION

The invention relates to a memory device comprising a memory chip and a controller, which can be connected to a computer via a USB (Universal Serial Bus) connector.

Such a memory device is known in various embodiments, in which the housing of the memory device is a rectangular block, a key ring or the like, for example. The USB connector is fixedly connected to the housing of the memory device, and usually a loose protective cap or the like is used for the USB connector to protect the USB connector from damage, dirt and the like. One drawback of the known memory device is the fact that, due to the selected shape of the housing, it is usually not possible, for example in the case of computers having two more USB ports positioned adjacently to each other, to connect two memory devices to said slots at the same time. In addition, the housing of the known memory device makes it difficult to simply store or mail the memory device.

DE-U-202 07 720 and U.S. Pat. No. 6,567,273 disclose a memory device of this type, wherein the USB connector is movable between a position of rest, in which the connector is accommodated in an opening of the memory device, and an operative position, in which the connector projects beyond the perimeter of the memory device. In the position of rest the connection side of the USB connector is accessible from the outside so that the connector can easily be damaged and/or dirt can cause malfunctioning.

The object of the invention is to provide a memory device of the kind as referred to above, in which the draw-backs of the known memory device are eliminated in a simple yet efficient manner.

SUMMARY OF THE INVENTION

In order to accomplish that objective, the memory device is a flat memory card with an opening lying entirely within the perimeter of the memory card, wherein in the position of rest the USB connector is positioned entirely within the confines of the memory card.

Since the USB connector is positioned within the confines of the memory card in the position of rest, said connector does not form an obstruction in any way, and the connector is protected against being damaged. Loose protective parts are no longer needed. In the operative position, the connector can be inserted into a respective port of the computer without any difficulty and, due to the small dimensions of the memory card, the memory device does not form an impediment as regards the use of adjacent ports. Moreover, the flat memory card shape enables easy storage or mailing by the user. This is obtained in particular in preferred embodiments, in which the memory card has major surface area dimensions similar to a standard credit card or of a 3.5 inch floppy disk.

In an advantageous embodiment, a second connector is accommodated within a second opening of the memory card lying entirely within the perimeter of the memory card, the second connector being movable between a position of rest, in which said second connector is positioned entirely within the confines of the memory card, and an operative position, in which said second connector projects beyond the perimeter of the memory card, with said second connector being connected to the memory chip via an associated controller. Said second connector is in the form of a connector via which the memory device can be connected to any multimedia appliance, such as an MP3 player, a PDA (personal digital assistant), a digital video camera, a digital photo camera, a mobile telephone or the like. In this way, the memory device can be used as a storage medium for such appliances, and the stored data can easily be recorded on the hard disk of a PC (personal computer) via the first connector and/or be processed in the PC. It is also possible, of course, to make the data stored on a PC accessible to the electronic appliance via said second connector.

BRIEF DESCRIPTION OF THE DRAWINGS

The invention will be explained in more detail hereinafter with reference to the drawing, which schematically shows a few embodiments of the memory device according to the invention.

FIG. 1 is a top plan view of a first embodiment of the memory device according to the invention, in which the first connector is shown in the position of rest.

FIG. 2 is a side elevation of the memory device of FIG. 1.

FIG. 3 is a cross-sectional view of the memory device of FIG. 1, along the line III—III.

FIG. 4 is a top plan view of the memory device of FIG. 1, in which the first connector is shown in a possible operative position, which figure furthermore schematically shows a side elevation of the first connector.

DETAILED DESCRIPTION OF ILLUSTRATIVE EMBODIMENTS

Figure 5:
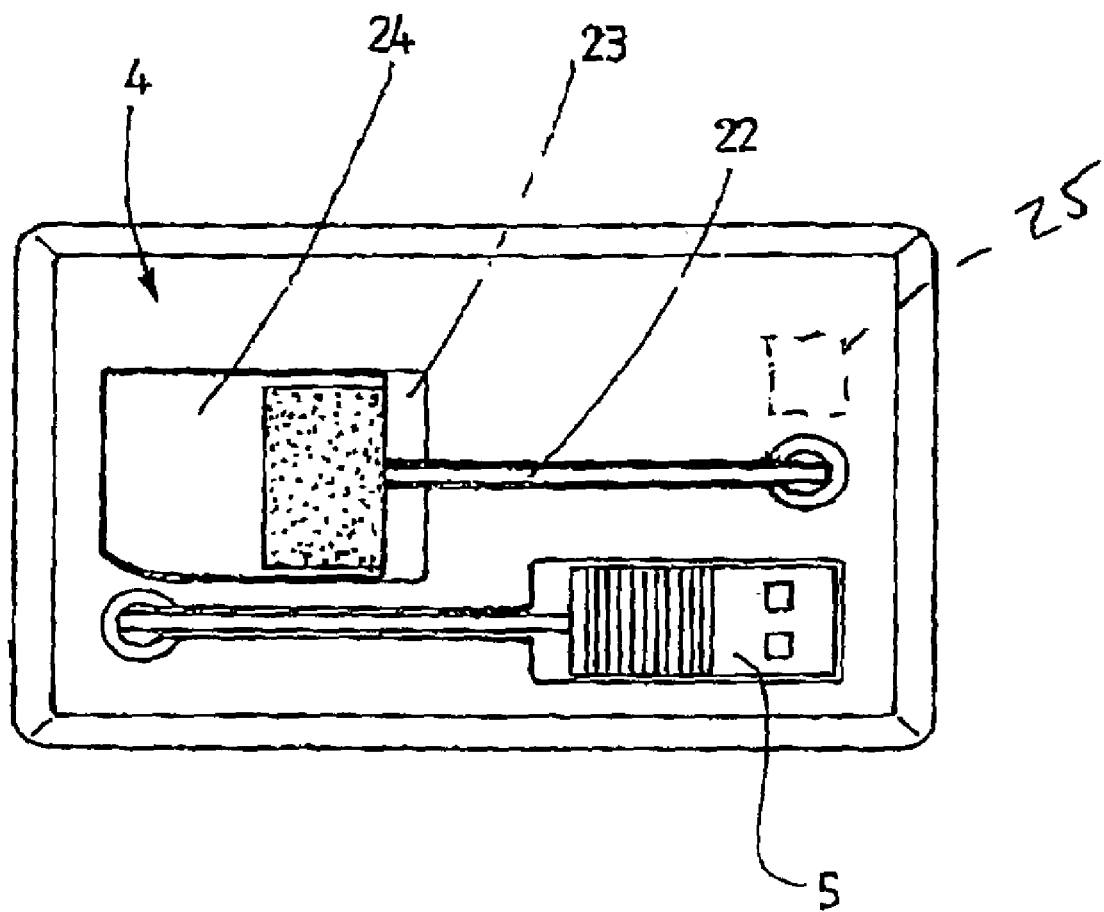
FIG. 5 is a schematic top plan view of a second embodiment of the memory device according to the invention, which is provided with a second connector.

FIGS. 1–4 show a memory device, with the top plan view of FIG. 1 illustrating a printed circuit board 1 in a dashed line, on which printed circuit board inter alia a memory chip 2 and a USB controller or interface 3 are present. As appears from FIGS. 1–4, the memory device is in the form of a flat memory card 4 of rectangular shape, which, in the preferred embodiment thereof, has the surface area dimensions of a standard credit card, i.e. about 54×85 mm. The memory card 4 comprises a USB connector 5, by means of which the memory device can be connected to a USB port of a computer (not shown). The USB connector 5 is movable between a position of rest (shown in FIG. 1), in which the USB connector is positioned within the confines of the memory card 4, and an operative position shown in FIG. 4, in which the USB connector projects beyond the perimeter of the memory card 4. In the embodiment that is shown in FIGS. 1–4, the USB connector 5 is connected to the memory card via a cable 6, which cable is connected to the printed circuit board 1 within the memory card 4.

The memory card 4 is provided with an opening 7, whose dimensions substantially correspond to the dimensions of the USB connector 5. In the position of rest shown in FIG. 1, the USB connector 5 is present in the opening 7. In the embodiment that is shown in FIGS. 1–4, the opening is a rectangular opening lying entirely within the perimeter of the memory card, with a projecting cam 8 being present on a short side of the rectangular opening. In the position of rest, the USB connector 5 is slid on the cam 8 with an insertion end 9. Furthermore, a cam 10 is present on at least one long side, in this case on both long sides, of the opening 7, which cam mates with L-shaped slots 11 formed in the long sides of the USB connector 5. The mating cams 10 and slots 11 form guiding and retaining means for the USB connector 5.

Since the length of the opening 7 is slightly larger than that of the connector 5 in the embodiment that is shown in FIGS. 1–4, the USB connector 5 can be removed from the opening for use by first sliding the connector off the cam 8 and subsequently lifting it out of the opening 7, as a result of which the cams 10 will move out of the slots 11. Since the USB connector 5 is connected to the memory card 4 via the cable 6, the connector 5 can subsequently be inserted into a USB port of a computer without any difficulty, and the memory card 4 can be placed in any desired position.

As appears from the side elevation of FIG. 2, the thickness of the memory card corresponds at least to the thickness of the insertion end 9 of the USB connector 5, which is adapted to the usual standard. As a result, the USB connector 5 is positioned entirely within the confines of the memory card 4 in the position of rest. From FIGS. 2 and 3 it furthermore appears that the edges of the memory card 4 are provided with a bevel 12, so that the thickness of the memory card 4 at the perimeter thereof corresponds to the usual thickness of a standard credit card.

Furthermore, a gripping area 13 is present on a long side and a short side of the memory card 4, which gripping area may be provided with a roughened surface and which may have an upright edge on the outer side. This enables easy removal of the memory card 4 when stored in a storage compartment intended for a credit card.

FIG. 5 shows a second embodiment of the memory device, which is mainly identical to the memory device of FIG. 1. Like parts are indicated by the same numerals. In this embodiment, the memory device is provided with a second connector 22, which is mounted in an opening 23 of the memory card 4 and which is connected to the memory chip 2 via a cable 24 and an associated controller 25. Said second connector 22 is suitable for connection to a multimedia appliance, such as an MP3 player, a PDA, a digital video camera, a digital photo camera, a mobile telephone or the like. The memory device can thereby also function as, for example, an SD (secure digital) card, a Multimedia card, a Compact Flash card, a Memory Stick, a Smart Media card or the like. The thickness of the second connector 22 is smaller than that of the USB connector 5, so that the connector 22 is positioned entirely within the confines of the memory card 4.

The advantage of this embodiment of the memory device is the fact that the memory device can be used as a storage medium for multimedia appliances of the above kind. The stored data can easily be stored on the hard disk of a PC via the USB connector 5 and/or be processed in the PC. It is also possible, of course, to make the data stored on a PC accessible to the electronic appliance via said second connector 22.

From the foregoing it will be apparent that the invention provides a memory device which, as a result of its configuration as a flat memory card, within the confines of which the connector or connectors can be fully accommodated, can easily be stored so as to be carried along or be mailed by the user. Since the connector(s) is/are movable with respect to the memory card from the position of rest to an operative position, the connector(s) can easily be inserted into a suitable slot of a computer or multimedia appliance in the operative position. The movable connection between the connector and the memory card makes it possible to position the memory card in such a manner with respect to the connector that any adjacent slots of the computer remain available for use. A rectangular shape of the memory card corresponding to the rectangular shape of a standard credit card is preferred. Alternatively, the memory card may also have the major surface dimensions of a 3.5 inch floppy disk as illustrated in FIG. 4 at 26.

The invention is not limited to the embodiments as described in the foregoing, which can be varied in several ways within the scope of the claims.

What is claimed is:

1. A memory device comprising a memory chip and a controller, which is configured to be connected to a computer via a USB connector, the USB connector being movable between a position of rest, in which the USB connector is accommodated in an opening of the memory device, and an operative position, in which the USB connector projects beyond the perimeter of the memory device, wherein the memory device is a flat memory card with the opening lying entirely within the perimeter of the memory card, and wherein in the position of rest the USB connector is positioned in the opening and entirely within the confines of the memory card such that an inner wall of the opening encircles the USB connector, wherein a short side of the opening is provided with a projecting cam, wherein the associated USB connector is positioned on the cam in the position of rest, wherein the surface area dimensions of the memory card correspond to the surface are dimensions of a standard credit card, and wherein the thickness of the memory card is at least equal to the thickness of the insertion end of the USB connector.

2. The memory device according to claim 1, wherein a second connector is accommodated within a second opening of the memory card lying entirely within the perimeter of the memory card, the second connector being movable between a position of rest, in which said second connector is positioned entirely within the confines of the memory card, and an operative position, in which said second connector projects beyond the perimeter of the memory card, with said second connector being connected to the memory chip via an associated controller.

3. The memory device according to claim 1, wherein the USB connector is connected to the memory card by means of a cable.

4. The memory device according to claim 1, wherein at least one long side of the rectangular opening and an adjoining side in the position of rest of the associated USB connector are provided with mating guiding and retaining elements.

5. The memory device according to claim 1, wherein the second connector is in the form of a connector intended for being connected to a PDA, a digital photo or video camera, a mobile telephone or the like.

6. A memory device comprising a memory chip and a controller, which is configured to be connected to a computer via a USB connector, the USB connector being movable between a position of rest, in which the USB connector is accommodated in an opening of the memory device, and an operative position, in which the USB connector projects beyond the perimeter of the memory device, wherein the memory device is a flat memory card with the opening lying entirely within the perimeter of the memory card such that an inner wall of the opening encircles the USB connector, and wherein the position of rest the USB connector is positioned in the opening and entirely within the confines of the memory card, wherein a short side of the opening is provided with a projecting cam, wherein the associated USB connector is positioned on the cam in the position of rest, wherein the surface area dimensions of the memory card correspond to the surface area dimensions of a 3.5 inch floppy disk, and wherein the thickness of the memory card is at least equal to the thickness of the insertion end of the USB connector.

7. The memory device according to claim 6, wherein a second connector is accommodated within a second opening of the memory card lying entirely within the perimeter of the memory card, the second connector being movable between a position of rest, in which said second connector is positioned entirely within the confines of the memory card, and an operative position, in which said second connector projects beyond the perimeter of the memory card, with said second connector being connected to the memory chip via an associated controller.

8. The memory device according to claim 6, wherein the USB connector is connected to the memory card by means of a cable.

9. The memory device according to claim 6, wherein at least one long side of the rectangular opening and an adjoining side in the position of rest of the associated USB connector are provided with mating guiding and retaining elements.

10. The memory device according to claim 6, wherein the second connector is in the form of a connector intended for being connected to a PDA, a digital photo or video camera, a mobile telephone or the like.

11. A memory device comprising a memory chip and a controller, which is configured to be connected to a computer via a USB connector, the USB connector being movable between a position of rest, in which the USB connector is accommodated in an opening of the memory device, and an operative position, in which the USB connector projects beyond the perimeter of the memory device, wherein the memory device is a flat memory card with the opening lying entirely within the perimeter of the memory card and extending from one major surface through to an opposite major surface, and wherein in the position of rest the USB connector is positioned in the opening and entirely within the confines of the memory card such that an inner wall of the opening encircles the USB connector, wherein a short side of the opening is provided with a structure adapted to position an insertion end of the USB connector proximate a portion of the inner wall in the position of rest, wherein the surface area dimensions of the memory card correspond to the the surface area dimensions of a standard credit card, and wherein the thickness of the memory card is at least equal to the thickness of the insertion end of the USB connector.

12. The memory devices of claim 11 wherein the structure comprises a projecting cam.

* * * * *